United States Patent
Cheng et al.

(10) Patent No.: US 7,851,378 B2
(45) Date of Patent: Dec. 14, 2010

(54) METHOD FOR GROWING GE EXPITAXIAL LAYER ON PATTERNED STRUCTURE WITH CYCLIC ANNEALING

(75) Inventors: Ming-Hsin Cheng, Hsinchu (TW);
Shih-Chiang Huang, Hsinchu (TW);
Tsung-Chieh Cheng, Hsinchu (TW);
Guang-Li Luo, Hsinchu (TW);
Chinq-Long Hsu, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 763 days.

(21) Appl. No.: 11/898,345

(22) Filed: Sep. 11, 2007

(65) Prior Publication Data

US 2010/0216298 A1    Aug. 26, 2010

(51) Int. Cl.
*H01L 21/02*   (2006.01)
*H01L 21/20*   (2006.01)

(52) U.S. Cl. ............... 438/761; 438/795; 257/E21.002

(58) Field of Classification Search ................ 438/758, 438/759, 761, 795, 796; 257/E21.002, E21.532
See application file for complete search history.

(56) References Cited

U.S. PATENT DOCUMENTS

| | | | | |
|---|---|---|---|---|
| 6,537,370 | B1 * | 3/2003 | Hernandez et al. | 117/88 |
| 6,635,110 | B1 * | 10/2003 | Luan et al. | 117/4 |
| 7,037,856 | B1 * | 5/2006 | Maa et al. | 438/758 |
| 2003/0127646 | A1 * | 7/2003 | Christiansen et al. | 257/55 |
| 2004/0235274 | A1 * | 11/2004 | Kurita et al. | 438/483 |
| 2005/0070115 | A1 * | 3/2005 | Maa et al. | 438/706 |
| 2006/0063358 | A1 * | 3/2006 | Bedell et al. | 438/483 |

* cited by examiner

*Primary Examiner*—Matthew S Smith
*Assistant Examiner*—Michele Fan
(74) *Attorney, Agent, or Firm*—Jackson IPG PLLC; Demian K. Jackson

(57) ABSTRACT

A Ge epitaxial layer is grown on a silicon substrate with a patterned structure. Through a cyclic annealing, dislocation defects are confined. The present invention provides a method for manufacturing a high-quality Ge epitaxial layer with a low cost and a simple procedure. The Ge epitaxial layer obtained can be applied to high mobility Ge devices or any lattice-mismatched epitaxy on a photonics device.

8 Claims, 7 Drawing Sheets

METHOD FOR GROWING GE EXPITAXIAL LAYER ON PATTERNED STRUCTURE WITH CYCLIC ANNEALING

FIELD OF THE INVENTION

The present invention relates to growing a germanium (Ge) epitaxial layer; more particularly, relates to depositing a high-quality Ge epitaxial layer on a silicon substrate by using an ultra high vacuum chemical vapor deposition (UHV/CVD) and combining with a patterned structure and a cyclic annealing process.

DESCRIPTION OF THE RELATED ART(S)

A prior art describes that before growing a Ge epitaxial layer, multiple graded silicon-germanium (Si—Ge) buffer layers have to be grown on a Si substrate. Yet, it takes too many steps to obtain a desired throughput. Thus, the production is not satisfied.

Other prior arts utilize a selectively epitaxial growth and a multi-step growth. In this method, a Ge epitaxial layer was selectively grown on a Si substrate having an amorphous oxide layer. However, only a part of the grown Ge epitaxial layer has a good quality. A great rest part of the Ge epitaxial layer is polycrystalline on the amorphous oxide layer and has large amount of grain boundary. As a result, the quality is not good.

The multi-step growth has to grow a graded buffer layer on a Si substrate for several times before growing a Ge epitaxial layer. Nevertheless, it takes too much time, and the manufacturing environment is hard to control. Consequently, production is limited. Hence, the prior arts do not fulfill all users' requests in actual use.

SUMMARY OF THE INVENTION

The main purpose of the present invention is to confine dislocation defects and reduce a dislocation density and a surface roughness of a Ge epitaxial layer through a cyclic annealing while quality of the Ge epitaxial layer is improved with a low cost and a simplified manufacturing process.

Another purpose of the present invention is to obtain high mobility Ge device on a Si substrate and any lattice-mismatched epitaxy on a photonics device.

To achieve the above purposes, the present invention is a method for growing a Ge epitaxial layer on a patterned structure with a cyclic annealing, comprising steps of: (a) depositing a Si buffer layer and a Si—Ge epitaxial layer on a Si substrate through an UHV/CVD; (b) processing a photolithography; (c) processing an etching to define a patterned structure of the Si—Ge epitaxial layer; (d) depositing a Ge epitaxial layer on the Si—Ge epitaxial layer; and (e) processing a cyclic annealing to confine dislocation defects on sidewalls of the Si—Ge epitaxial layer. Accordingly, a novel method for growing a Ge epitaxial layer on a patterned structure with a cyclic annealing is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
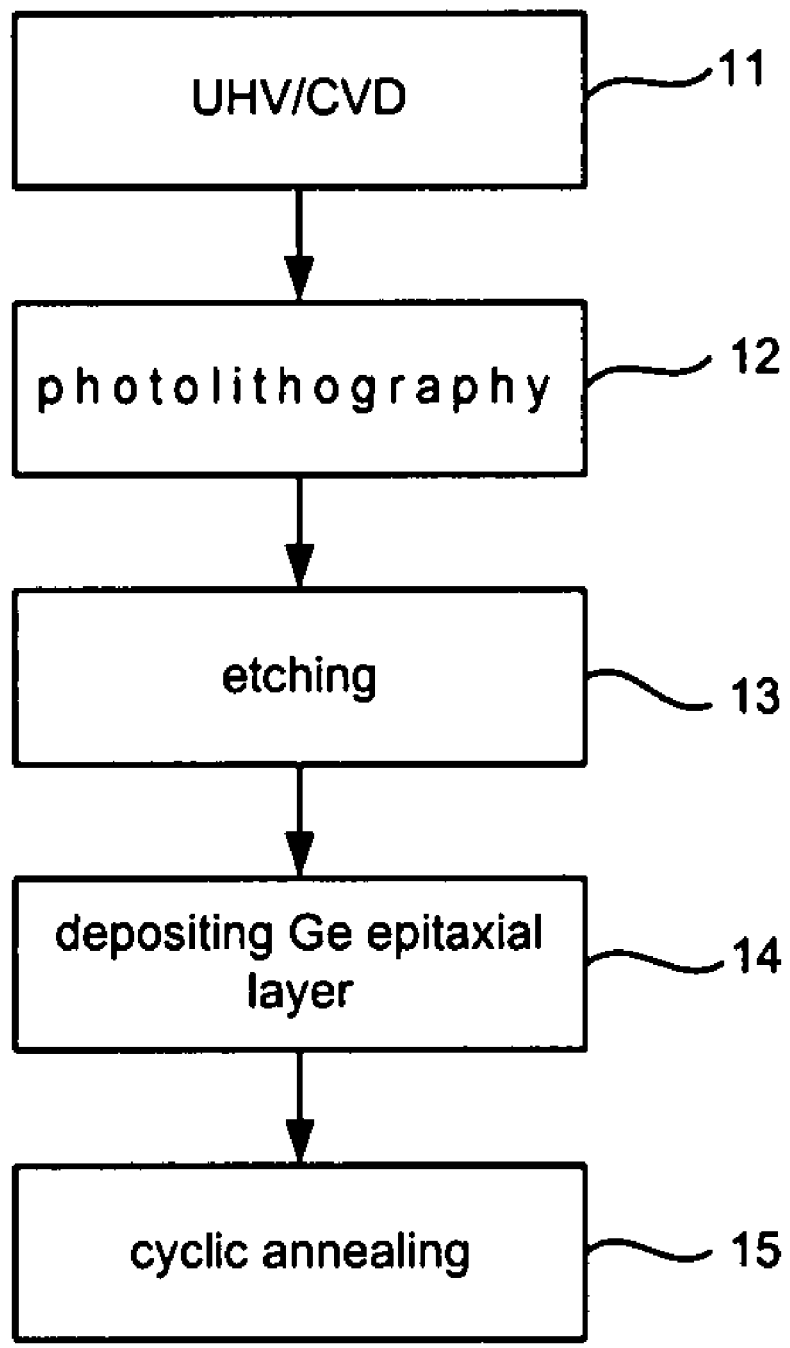
FIG. 1 is the flow diagram showing the preferred embodiment according to the present invention.
Figure 2:
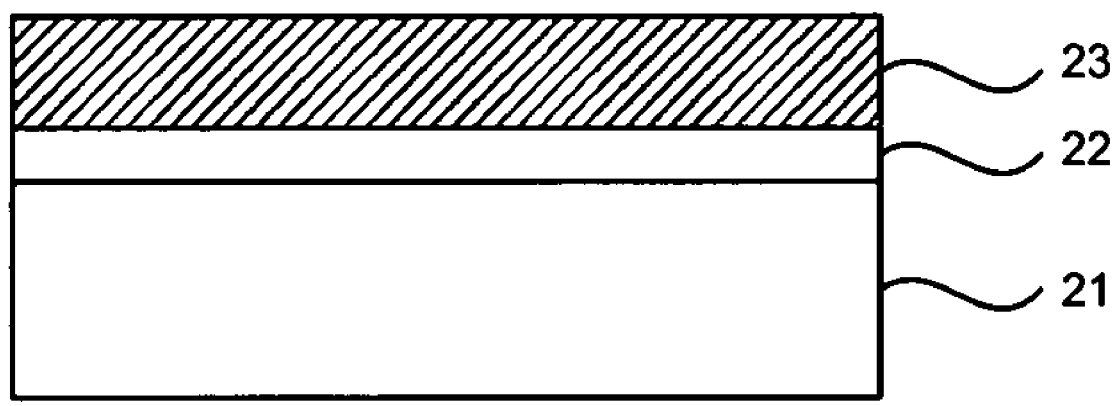
FIG. 2 is the diagram showing the ultra high vacuum chemical vapor deposition.

Please refer to FIG. 1 to FIG. 7, which are a flow diagram showing the preferred embodiment according to the present invention; and diagrams showing an ultra high vacuum chemical vapor deposition, a photolithography, an etching, a process of depositing the Ge epitaxial layer, a cyclic annealing, and confinement of dislocation defects. As shown in the figures, the present invention is a method for growing a germanium (Ge) epitaxial layer on a patterned structure with a cyclic annealing, comprising the following steps:

(a) Processing an UHV/CVD 11: As shown in FIG. 2, a silicon (Si) substrate 21 is obtained, which is processed through a wet cleansing and then is soaked in a hydrogen fluoride (HF) solution to be heated for removing oxide formed naturally on the Si substrate. Then, an ultra high vacuum chemical vapor deposition (UHV/CVD) is processed under a certain operational condition to deposit a Si buffer layer 22 and a Si—Ge epitaxial layer 23 ($Si_{0.8}Ge_{0.2}$) on the cleansed Si substrate 21, where the Si—Ge epitaxial layer 23 has a thickness of 0.08 micrometers (μm).

Figure 3:
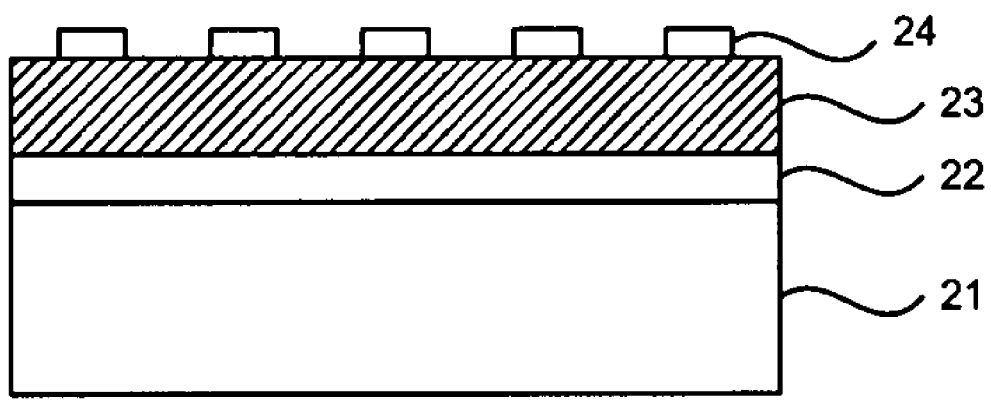
FIG. 3 is the diagram showing the photolithography.

(b) Processing a photolithography 12: As shown in FIG. 3, on processing an I-line photolithography, a photoresist 24 is pasted on the Si—Ge epitaxial layer 23 and then a pattern is projected on the photoresist 24 with a photo mask.

Figure 4:
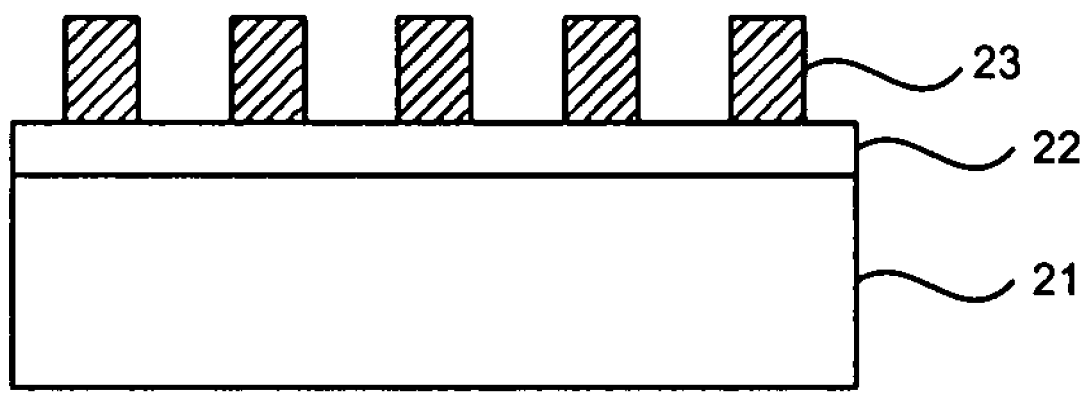
FIG. 4 is the diagram showing the etching.

(c) Processing an etching 13: As shown in FIG. 4, a dry plasma etching is processed to remove an exposed part of the Si—Ge epitaxial layer 23. And then the part of the photoresist under the exposed part of the Si—Ge epitaxial layer 23 is further removed to define a required pattern on the Si—Ge epitaxial layer 23.

Figure 5:
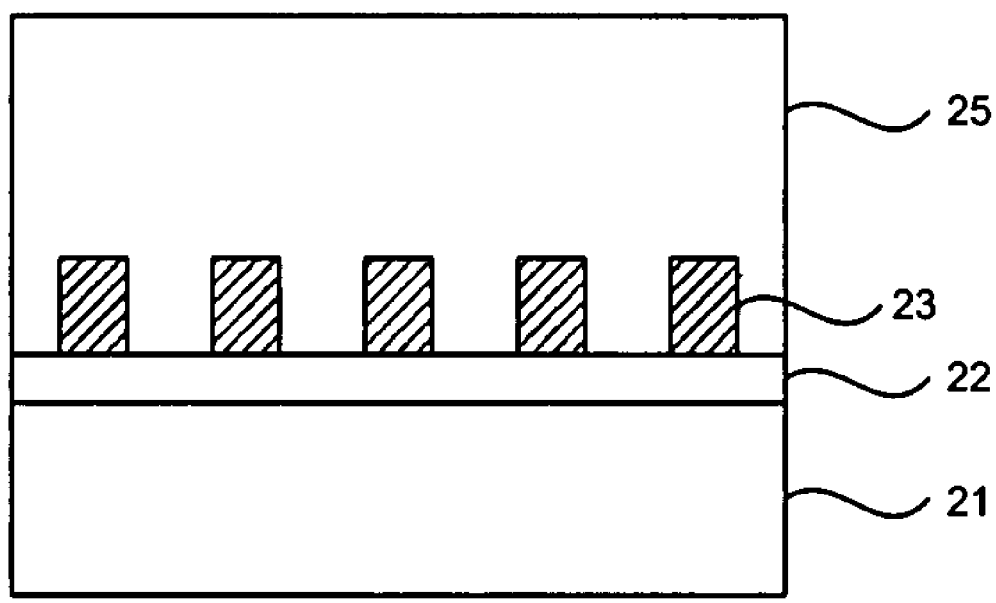
FIG. 5 is the diagram showing the process of depositing the Ge epitaxial layer.

(d) Depositing a Ge epitaxial layer 14: As shown in FIG. 5, after the photolithography and the etching, a reaction gas of germanium tetrahydride ($GeH_4$) is used with a flow of 10 milliliter per second and a reaction time of 18 hours under 430 Celsius degrees (° C.) so that a Ge epitaxial layer 25, having a thickness of 0.36 μm, is deposited on the Si—Ge epitaxial layer 23.

Figure 6:
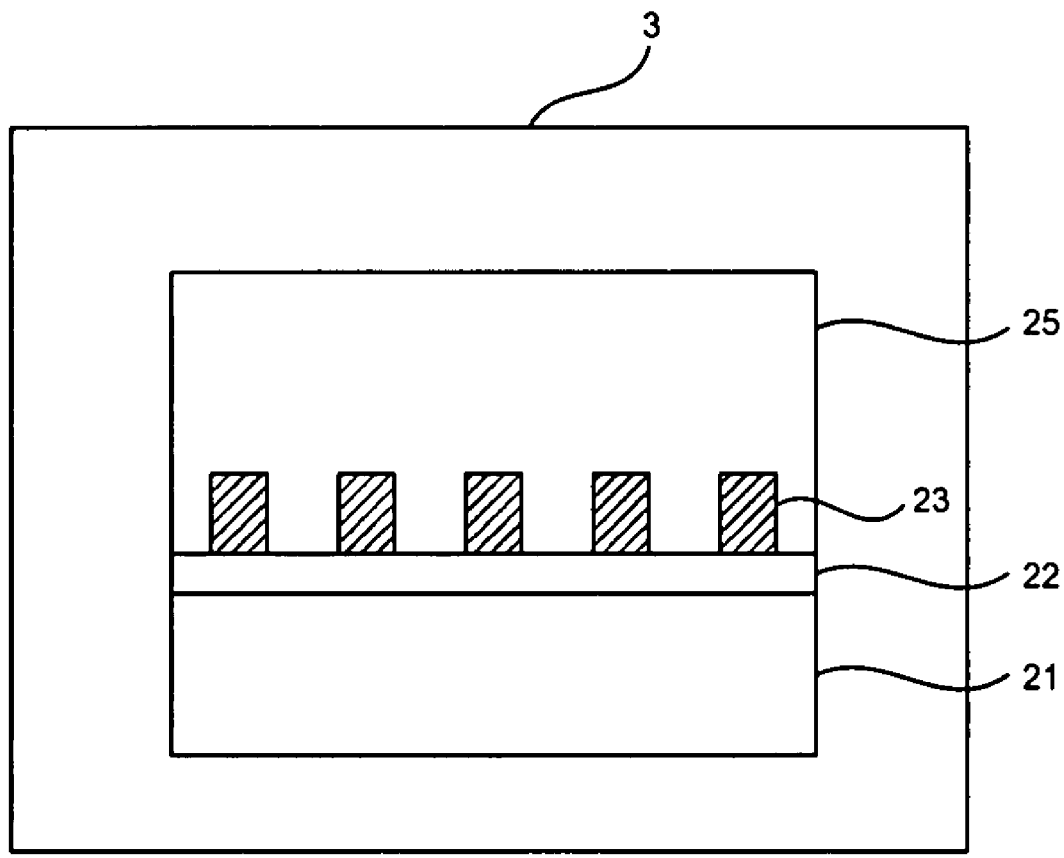
FIG. 6 is the diagram showing the cyclic annealing.
Figure 7:
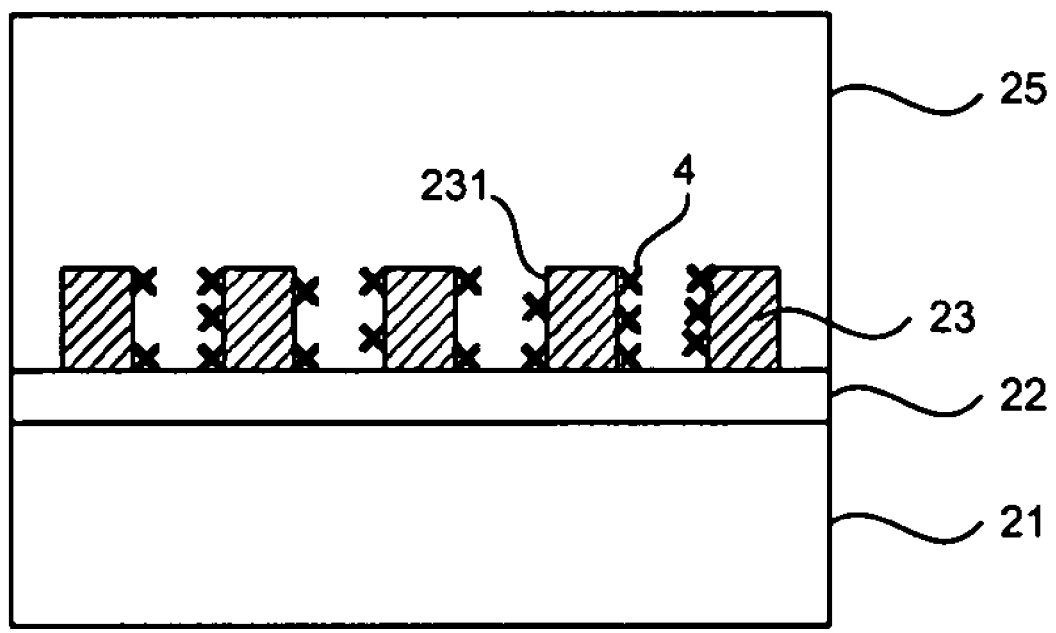
FIG. 7 is the diagram showing how the dislocation defects are confined.

(e) Processing a cyclic annealing 15: As shown in FIG. 6 and FIG. 7, an annealing device 3 is used to process a cyclic annealing. The cyclic annealing comprises 5 periods, where the period comprises 10 minutes (min) to maintain at 780° C. and a time to be heated to 900° C. and maintained at that temperature for another 10 min before cooling down to a room temperature. Through the process, dislocation defects 4 are confined on sidewalls 231 of the Si—Ge epitaxial layer 23. In this way, a method for depositing the high-quality Ge epitaxial layer 25 on the Si substrate 21 is provided.

Hence, the present invention describes a method to confine dislocation defects of a Ge epitaxial layer using a patterned structure of a Si—Ge epitaxial layer. Together with a coordination of a cyclic annealing, both a dislocation density and a surface roughness of the Ge epitaxial layer are further reduced so that a quality of the Ge epitaxial layer is improved. The present invention has a low cost and a simple manufacturing process, which is suitable for high mobility Ge device on a Si substrate and any lattice-mismatched epitaxy on a photonics device to be easily integrated in a standard Si wafer.

To sum up, the present invention describes a method for growing a Ge epitaxial layer on a patterned structure with a cyclic annealing, where the dislocation defects are confined on sidewalls of the patterned Si—Ge epitaxial layer; both dislocation density and surface roughness of the grown Ge epitaxial layer is reduced with a coordination of a cyclic annealing so that a quality of the Ge epitaxial layer is improved; and cost is reduced and a manufacturing process is simplified, which is suitable for any lattice-mismatched epitaxy to be easily integrated in a standard Si wafer.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for growing a germanium (Ge) epitaxial layer on a patterned structure with a cyclic annealing, comprising steps of:
    (a) obtaining a silicon (Si) substrate and depositing a Si buffer layer and a Si—Ge epitaxial layer ($Si_{0.8}Ge_{0.2}$) through an ultra high vacuum chemical vapor deposition (UHV/CVD);
    (b) processing a photolithography by pasting a layer of photoresist on said Si—Ge epitaxial layer and projecting a required pattern on said photoresist with a photo mask;
    (c) processing an etching to remove an exposed part of said Si—Ge epitaxial layer and then remove said photoresist over an unexposed part of said Si—Ge epitaxial layer to obtain a patterned structure of said Si—Ge epitaxial layer;
    (d) after said photolithography and said etching, depositing a Ge epitaxial layer on said Si—Ge epitaxial layer by using a reaction gas; and
    (e) processing a cyclic annealing to confine dislocation defects on sidewalls of said Si—Ge epitaxial layer.

2. The method according to claim 1,
    wherein said Si substrate is processed through a wet cleansing and then is soaked in a hydrogen fluoride (HF) solution to be heated to remove oxide formed naturally on said Si substrate.

3. The method according to claim 1,
    wherein said Si—Ge epitaxial layer has a thickness of 0.08 micrometers (µm).

4. The method according to claim 1,
    wherein said photolithography is an I-line photolithography.

5. The method according to claim 1,
    wherein said etching is a dry plasma etching.

6. The method according to claim 1,
    wherein said Ge epitaxial layer has a thickness of 0.36 µm.

7. The method according to claim 1,
    wherein said reaction gas in step (d) is germanium tetrahydride ($GeH_4$), having a flow of 10 milliliter per second and a reaction time of 18 hours under 430 Celsius degrees (° C.).

8. The method according to claim 1,
    wherein said cyclic annealing comprises 5 periods of 10 minutes (min) to maintain at 780° C. and a time to be heated up to 900° C. and maintained at 900° C. for 10 min.

* * * * *